US012768071B2

(12) United States Patent
Kang et al.

(10) Patent No.: US 12,768,071 B2
(45) Date of Patent: Oct. 20, 2026

(54) EXTERNAL CRUCIBLE ACCOMMODATING SILICON MELT AND SILICON SINGLE CRYSTAL INGOT GROWTH APPARATUS INCLUDING THE SAME

(71) Applicant: SK SILTRON CO., LTD., Gumi-si Gyeongsangbuk-do (KR)

(72) Inventors: Ji Hoon Kang, Gyeongsangbuk-do (KR); Se Hun Kim, Gyeongsangbuk-do (KR); Ji Soo Yu, Gyeongsangbuk-do (KR)

(73) Assignee: SK SILTRON CO., LTD., Gumi-si Gyeongsangbuk-do (KR)

( * ) Notice: Subject to any disclaimer, the term of this patent is extended or adjusted under 35 U.S.C. 154(b) by 263 days.

(21) Appl. No.: 18/408,851

(22) Filed: Jan. 10, 2024

(65) Prior Publication Data

US 2024/0309542 A1 Sep. 19, 2024

(30) Foreign Application Priority Data

Mar. 16, 2023 (KR) ........................ 10-2023-0034469

(51) Int. Cl.
*C30B 15/10* (2006.01)
*C30B 15/14* (2006.01)
*C30B 29/06* (2006.01)

(52) U.S. Cl.
CPC .............. *C30B 15/10* (2013.01); *C30B 15/14* (2013.01); *C30B 29/06* (2013.01)

(58) Field of Classification Search
CPC .......... C30B 15/10; C30B 15/14; C30B 29/06
See application file for complete search history.

(56) References Cited

U.S. PATENT DOCUMENTS

| | | | | |
|---|---|---|---|---|
| 5,139,750 A * | 8/1992 | Shima | C30B 15/14 | 117/213 |
| 6,117,402 A * | 9/2000 | Kotooka | C30B 15/14 | 117/217 |
| 6,334,898 B1 * | 1/2002 | Bommier | C30B 15/10 | 117/200 |
| 2019/0017191 A1 * | 1/2019 | Kang | C30B 15/305 | |

FOREIGN PATENT DOCUMENTS

| | | | |
|---|---|---|---|
| CN | 202157141 U * | 3/2012 | C30B 15/10 |
| JP | 07-089789 * | 4/1995 | C30B 15/12 |
| SU | 1010431 A1 * | 4/1983 | C22B 9/00 |

OTHER PUBLICATIONS

English computer translation of CN-202157141-U (Year: 2025).*
English computer translation of JP 07-089789 (Year: 2025).*
English computer translation of SU-1010431-A1 (Year: 2026).*

* cited by examiner

*Primary Examiner* — Matthew J Song
(74) *Attorney, Agent, or Firm* — KED & Associates, LLP

(57) ABSTRACT

An external crucible accommodating a silicon melt is disclosed. The external crucible includes a body configured to accommodate a silicon melt and divided into first to n-th sections. At least one of the first to n-th sections is formed to have a shape different from shapes of remaining ones of the first to n-th sections.

5 Claims, 9 Drawing Sheets

EXTERNAL CRUCIBLE ACCOMMODATING SILICON MELT AND SILICON SINGLE CRYSTAL INGOT GROWTH APPARATUS INCLUDING THE SAME

CROSS-REFERENCE TO RELATED PATENT APPLICATIONS

This application claims the benefit of Korean Patent Application No. 10-2023-0034469, filed on Mar. 16, 2023, which is hereby incorporated by reference as if fully set forth herein.

BACKGROUND OF THE INVENTION

Field of the Invention

The present disclosure relates to an external crucible accommodating a silicon melt and a silicon single crystal ingot growth apparatus including the same, and more particularly to an external crucible accommodating a silicon melt, which is capable of growing ingots having various oxygen concentrations without changing a thermal insulator, and a silicon single crystal ingot growth apparatus including the same.

Discussion of the Related Art

Typically, a silicon wafer is manufactured through inclusion of a single crystal growth process for production of an ingot, a slicing process for slicing the ingot, thereby obtaining a wafer having a thin disc shape, a lapping process for removing damage, caused by mechanical machining, remaining in the wafer due to the slicing, a polishing process for mirror-polishing the wafer, and a cleaning process for mirror-polishing the polished wafer and removing an abrasive and foreign matter attached to the wafer.

Among the above-mentioned processes, the process for growing a silicon single crystal may be performed by heating a growth crucible with a high-purity silicon melt charged therein, thereby melting the raw material, and growing a silicon single crystal through a Czochralski method (referred to hereinafter as a "CZ method") or the like. A method to be implemented in the present disclosure may be applied to a CZ method in which a seed crystal is disposed on a silicon melt, thereby growing a single crystal.

The CZ method uses an internal crucible made of quartz and an external crucible made of graphite because it is necessary to manufacture a high-purity silicon single crystal ingot with a high yield, and a long time is required to raise the silicon single crystal ingot when the silicon single crystal ingot has a large diameter.

In addition, a magnetic field applied Czochralski (MCZ) method, in which a horizontal magnetic field is applied in order to control convection of a silicon melt, is known. In accordance with this method, the silicon melt is disposed in a quartz crucible, and the quartz crucible is disposed in a graphite crucible in order to maintain the structure of the quartz crucible at a high temperature.

Meanwhile, conventionally, a method of adjusting a thermal insulator and a heater is used to fix rotation of a silicon melt convection flow to one direction. For this reason, in practical cases, the convection flow direction is fixed to one direction before growth of an ingot.

For this reason, there may be a problem in that, for a product essentially requiring a convection flow in a leftward or rightward rotation direction for a different oxygen concentration or particular process conditions, it is necessary to replace the thermal insulator and the heater with new ones.

SUMMARY OF THE INVENTION

Accordingly, the present disclosure is directed to an external crucible accommodating a silicon melt and a silicon single crystal ingot growth apparatus including the same that substantially obviate one or more problems due to limitations and disadvantages of the related art.

An object of the present disclosure is to provide to an external crucible accommodating a silicon melt, which is capable of growing ingots having various oxygen concentrations, and a silicon single crystal ingot growth apparatus including the same.

Objects of the present disclosure are not limited to the above-described objects, and other objects of the present disclosure not yet described will be more clearly understood by those skilled in the art from the following detailed description.

To achieve these objects and other advantages and in accordance with the purpose of the disclosure, as embodied and broadly described herein, an external crucible accommodating a silicon melt includes a body configured to accommodate the silicon melt and divided into first to n-th sections, wherein at least one of the first to n-th sections is formed to have a shape different from shapes of remaining ones of the first to n-th sections.

At least one of the first to n-th sections may include a coating surface mounted to an outer surface thereof not contacting the silicon melt.

The coating surface may be made of a material different from a material of the body.

The first to n-th sections may be symmetrical with respect to a center of the body.

Gaps may be formed among the first to n-th sections, respectively.

At least one of the first to n-th sections may be formed to have a thickness different from thicknesses of remaining ones of the first to n-th sections.

At least one of the first to n-th sections may be formed to have, at an outer surface thereof not contacting the silicon melt, a surface area different from surface areas of remaining ones of the first to n-th sections.

The body may be made of a graphite material, and the coating surface may be made of an SiC material.

At least one of the first to n-th sections may be formed to have a greater thickness than thicknesses of remaining ones of the first to n-th sections.

At least one of the first to n-th sections may be formed to have, at an outer surface thereof, a greater surface area than surface areas of remaining ones of the first to n-th sections.

In another aspect of the present disclosure, an apparatus for growing a silicon single crystal includes a chamber, a quartz crucible provided in an interior of the chamber and configured to accommodate a silicon melt, the above-described external crucible configured to accommodate the quartz crucible, a heater provided in the interior of the chamber and disposed around the external crucible, a coolant tube provided at an upper portion of the interior of the chamber in a fixed state and disposed around an ingot rising while being grown from the silicon melt, and a heat shield provided at an upper portion of the quartz crucible.

The contents of the present disclosure described in conjunction with problems to be solved, solutions to the problems, and effects do not specify essential features of the claims and, as such, the scope of the claims is not limited to the matters described in the contents of the present disclosure.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION OF THE INVENTION

Hereinafter, the present disclosure will be described with reference to embodiments, for concrete description thereof, and the embodiments will be described in detail with reference to the accompanying drawings, for better understanding of the present disclosure.

However, the embodiments of the present disclosure may be modified to various different forms, and the scope of the present disclosure should not be interpreted as being limited to embodiments described below. The embodiments of the present disclosure are provided to more fully describe the present disclosure to those having ordinary skill in the art.

In addition, although relational terms such as "first", "second", "upper", "lower", etc. may be construed only to distinguish one element from another element without necessarily requiring or involving a certain physical or logical relation or sequence between the elements.

In an external crucible according to the present disclosure, which is configured to accommodate a silicon melt, a plurality of grooves is formed at an inner wall of a body, and plates may be disposed at the grooves in an inserted state, respectively. In addition, in a single crystal ingot growth apparatus, which will be described later, a quartz crucible thereof may be referred to as an "internal crucible", and a crucible made of graphite may be referred to as an "external crucible". A silicon melt may be directly accommodated in the quartz crucible, and the graphite crucible may support the quartz crucible.

Figure 1:
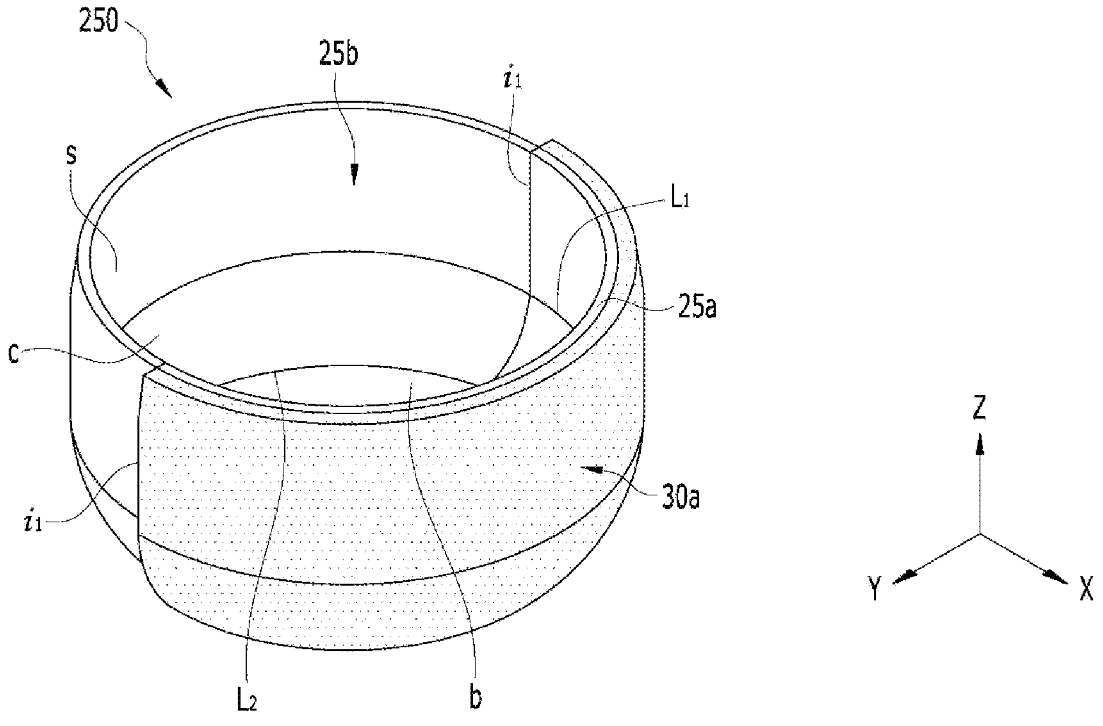
FIG. 1 is a view showing an external crucible according to an embodiment of the present disclosure, which is configured to accommodate a silicon melt.

FIG. 1 is a view showing an external crucible according to an embodiment of the present disclosure, which is configured to accommodate a silicon melt.

In an external crucible 250 according to this embodiment, which is configured to accommodate a silicon melt, a body thereof, which accommodates a silicon melt, may be made of graphite. The body may be divided into first to n-th sections. Here, "n" may be a natural number greater than 2. Although the body of FIG. 1 is shown as being divided into a first section 25*a* and a second section 25*b*, the present disclosure is not limited thereto.

Each of the first section 25*a* and the second section 25*b* may include a side wall s, a bottom surface b, and a connecting portion c configured to interconnect the side wall s and the bottom surface b while having a curvature.

For example, the cross-section of the side wall s may be flat, but may have a curvature, and the bottom surface b may also be flat and may have a curvature. The cross-section of the connecting portion c may have a curvature. Here, flatness and curvature may be determined with reference to the side wall s, the bottom surface b, and an inner wall of the connecting portion c.

Although a first boundary L1 between the side wall s and the connecting portion c and a second boundary L2 between the connecting portion c and the bottom surface b are shown in FIG. 1, these are shown only for convenience of expression, and may not be indicated at an inner surface of the body of the external crucible 250*a*.

The first to n-th sections may be configured to be symmetrical with respect to a center of the body. Here, the center of the body may be a mass center of the body or a virtual line extending from the mass center of the body in a vertical direction.

A gap i may be formed in a vertical direction between adjacent ones of the first to n-th sections. When the external crucible 250*a* thermally expands in a high-temperature process for producing a silicon melt through melting of silicon, the gap i is narrowed, whereas the gap i is enlarged when the external crucible 250*a* is cooled.

Although the gap i is shown in a pair in FIG. 1, the present disclosure is not limited thereto. In accordance with an embodiment, two or more of gaps i may be provided.

In addition, the first section 25*a* and the second section 25*b* may be formed to have different shapes, respectively. For example, the body may include a coating surface mounted to a portion of an outer surface thereof not contacting the silicon melt. The coating surface may be made of a material different from that of the body. This will be described later in detail.

Figure 2:
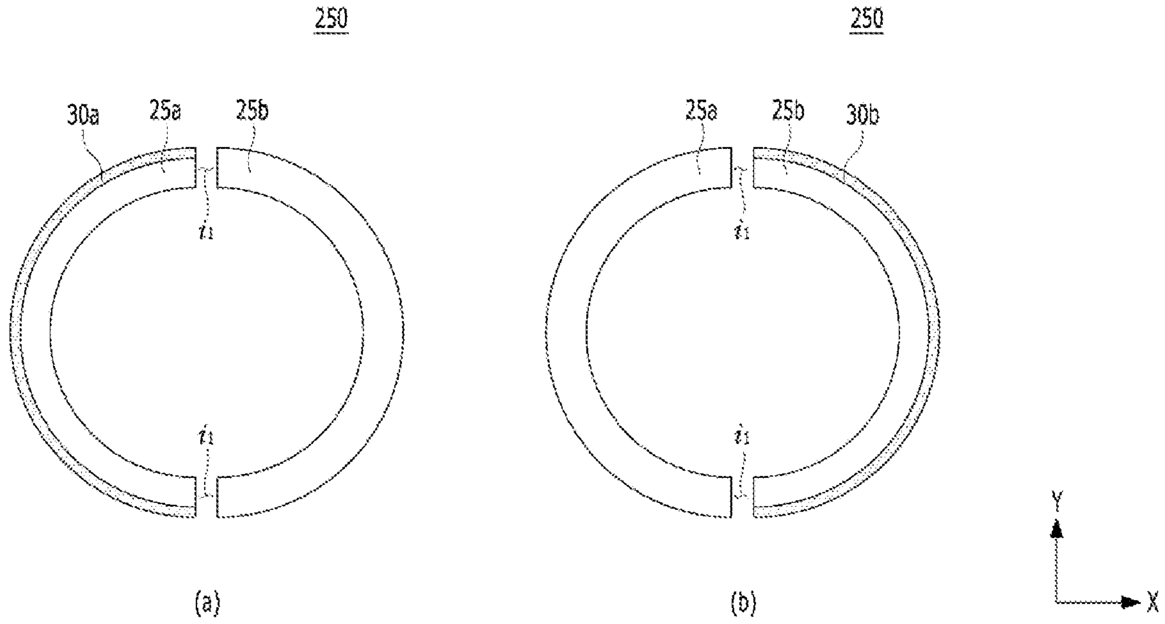
FIGS. 2(*a*) and (*b*) is a plan view of the external crucible of FIG. 1 accommodating a silicon melt.

FIG. 2 is a plan view of the external crucible of FIG. 1 accommodating a silicon melt.

Referring to FIGS. 2(*a*) and 2(*b*), the external crucible 250 may include the body divided into the first section 25*a* and the second section 25*b*. In this case, gaps i may be disposed between one end of the first section 25*a* and one end of the second section 25*b* and between the other end of the first section 25*a* and the other end of the second section 25*b*, respectively.

That is, the body is divided into the first section 25*a* and the second section 25*b*, and a coating surface 30*a*-30*b* coated with a material other than graphite may be mounted or coupled to an outer surface of the first section 25*a* or the second section 25*b*. Here, the outer surface may be referred to as an "outer circumferential surface" of the first section 25*a* or the second section 25*b*.

The coating surface 30*a*-30*b* may include a first coating surface 30*a* and a second coating surface 30*b*.

For example, the first coating surface 30*a* may be mounted to the outer circumferential surface of the first section 25*a*, as shown in FIG. 2(*a*), whereas the second coating surface 30*b* may be mounted to the outer circumferential surface of the second section 25*b*, as shown in FIG. 2(*b*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 25*a* and 25*b*, and coating an outer circumferential surface of one of the sections with a material other than graphite (for example, SiC or the like). Accordingly, it may be possible to form an asymmetrical heat distribution of a silicon melt (Si melt) in an interior of the internal crucible (for example, a quartz crucible) with reference to a magnetic field direction. This will be described later in detail.

Figure 3:
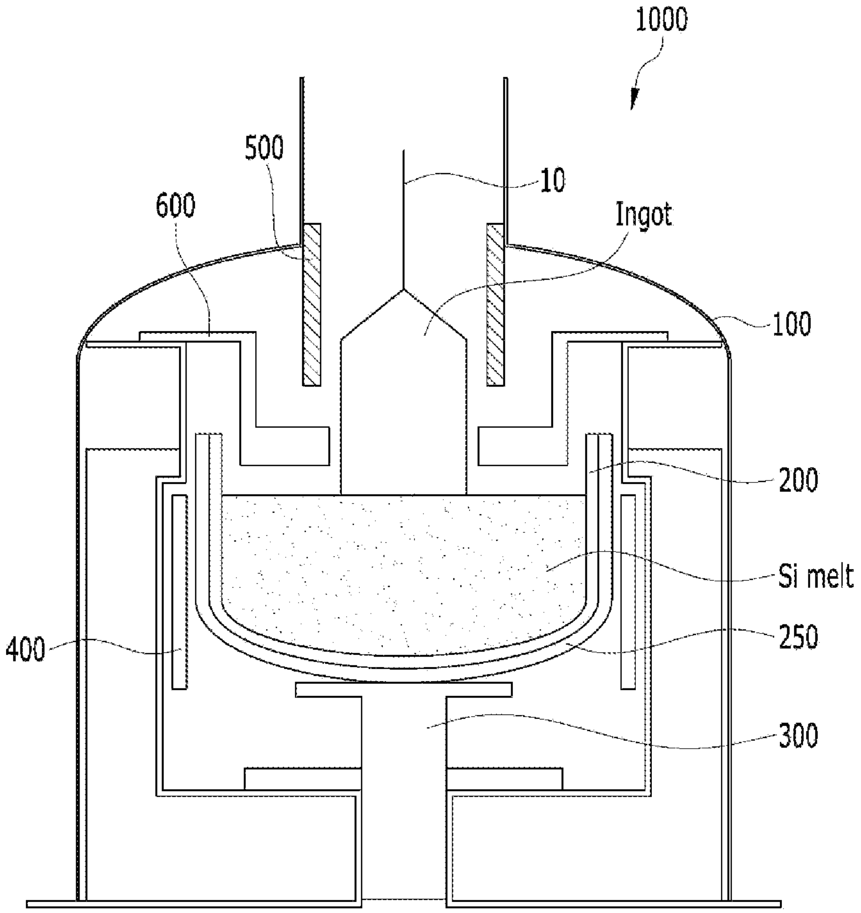
FIG. 3 is a view explaining a silicon single crystal ingot growth apparatus according to an embodiment of the present disclosure.

FIG. 3 is a view explaining a silicon single crystal ingot growth apparatus according to an embodiment of the present disclosure.

Referring to FIG. 3, the silicon single crystal ingot growth apparatus according to the embodiment of the present disclosure includes the above-described external crucible.

The silicon single crystal ingot growth apparatus according to the embodiment of the present disclosure, which is designated by reference numeral "1000", may include a chamber 100 formed therein with a space in which a silicon single crystal ingot is grown from a silicon melt (Si melt), internal and external crucibles 200 and 250 configured to accommodate the silicon melt (Si melt), a heater 400 configured to heat the internal and external crucibles 200 and 250, a heat shield 600 disposed at an upper portion of the internal crucible 200 in order to block heat of the heater 400 toward the silicon single crystal ingot, a seed chuck 10 configured to fix a seed (not shown) for growth of the silicon single crystal ingot, and a support 300 configured to rotate and raise the external crucible 250.

The growing silicon single crystal ingot may be raised by the seed chuck 10. In order to cool the rising hot silicon single crystal ingot, a coolant tube 500 may be disposed.

The chamber 100 may provide a space in which predetermined processes for formation of a silicon single crystal ingot from a silicon melt (Si melt) are performed.

The internal and external crucibles 200 and 250 may be provided in an interior of the chamber 100 in order to accommodate a silicon melt (Si melt). The internal crucible 200 may be made of quartz, whereas the external crucible 250 may be made of graphite.

The external crucible 250 may be configured to be divided into first to n-th sections, and gaps may be formed among the first to n-th sections, respectively, to cope with expansion of the internal crucible 200 by heat. For example, when the external crucible 250 is divided into a first section and a second section, a gap (cf. "i" in FIGS. 1 and 2) is formed between the first section (cf. "25*a*" in FIGS. 1 and 2) and the second section (cf. "25*b*" in FIGS. 1 and 2) and, as such, the external crucible 250 may not be damaged even when the internal crucible 200 expands.

In addition, the external crucible 250 may be coated with a coating surface (cf. "30*a*-30*b*" in FIGS. 1 and 2) at an outer surface thereof. That is, the coating surface (cf. "30*a*-30*b*" in FIGS. 1 and 2) may be mounted to an outer surface of at least one of the first to n-th sections. This will be described later in detail.

An insulator may be provided in the chamber 100 in order to prevent heat of the heater 400 from being outwardly dissipated. Although only the heat shield 600 disposed at upper portions of the internal and external crucibles 200 and 250 is shown in this embodiment, the present disclosure is not limited thereto. Insulators may be disposed at side surfaces and lower portions of the internal and external crucibles 200 and 250, respectively.

The heater 400 may melt a polycrystalline silicon supplied to an interior of the internal and external crucibles 200 and 250, thereby producing a silicon melt (Si melt). The heater 400 may receive current from a current supply rod (not shown) disposed thereunder.

The support 300 may be disposed at central portions of bottom surfaces of the internal and external crucibles 200 and 250, to support the internal and external crucibles 200 and 250. As the silicon melt (Si melt) is partially solidified and, as such, a silicon single crystal ingot may be grown from a seed (not shown) disposed at upper portions of the internal and external crucibles 200 and 250.

Figure 4:
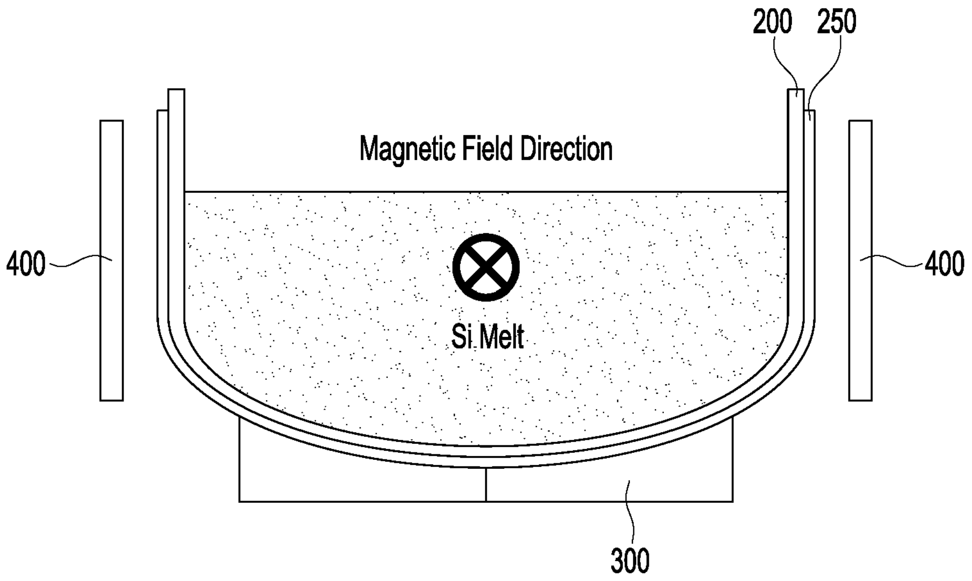
FIG. 4 is a view explaining measurement of a temperature of a crucible accommodating a silicon melt (Si melt), which is carried out in accordance with an embodiment of the present disclosure.
Figure 5:
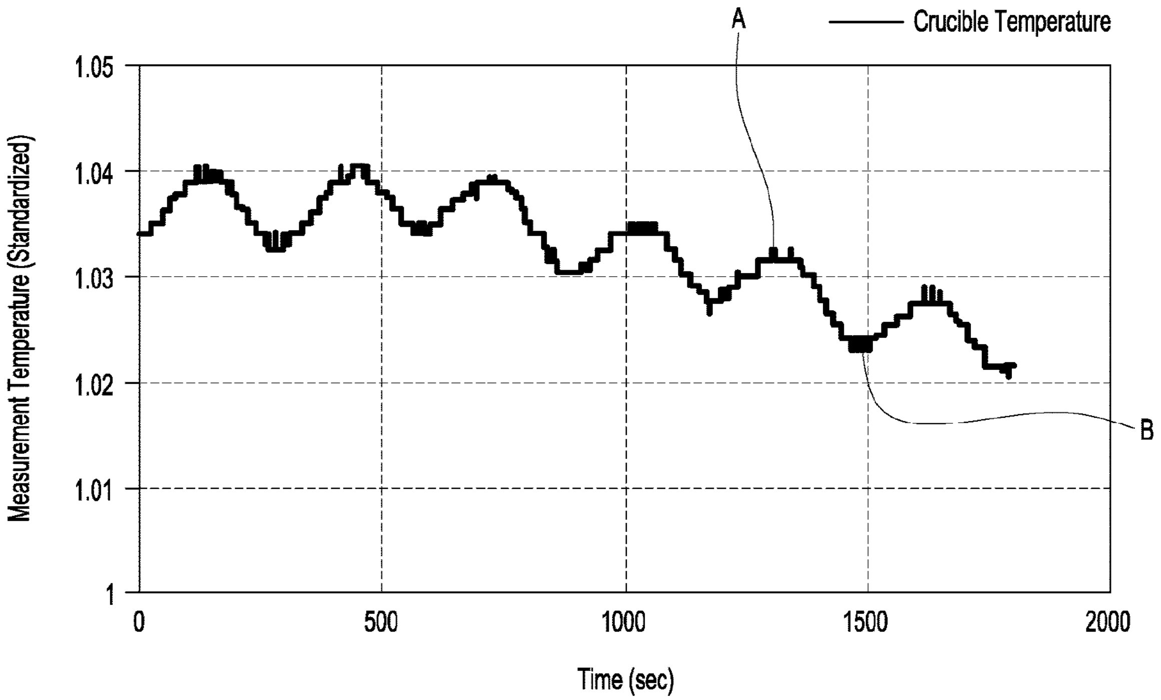
FIG. 5 is a graph explaining the temperature of the crucible measured by the measurement of FIG. 4.
Figure 6:
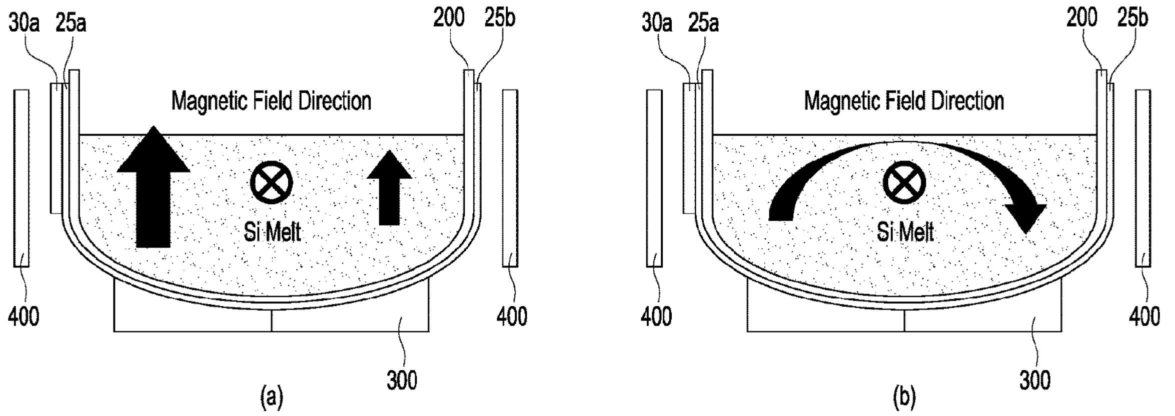
FIGS. 6(*a*) and (*b*) and 7(*a*) and (*b*) are views explaining that the silicon melt (Si melt) received in the crucible is varied in flow in accordance with a temperature thereof.
Figure 7:
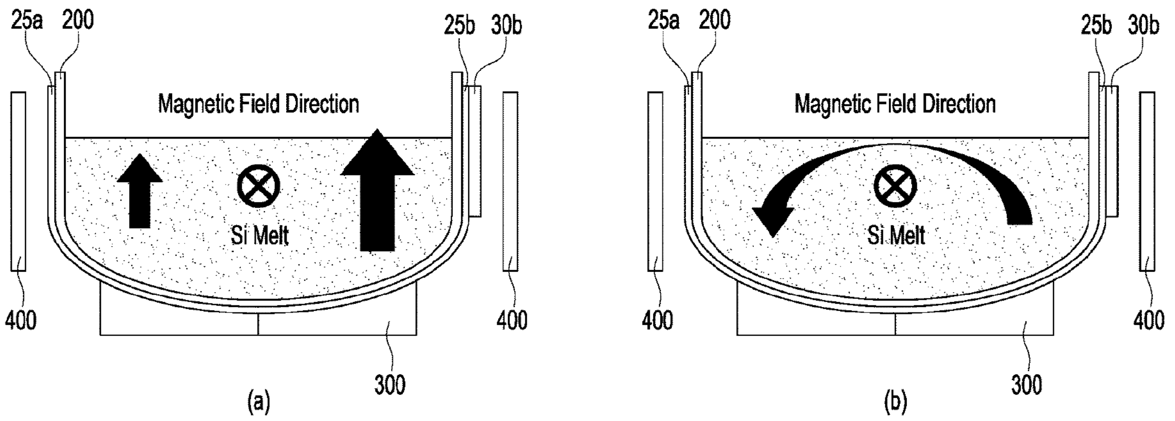

FIG. 4 is a view explaining measurement of a temperature of a crucible accommodating a silicon melt (Si melt), which is carried out in accordance with an embodiment of the present disclosure. FIG. 5 is a graph explaining the temperature of the crucible measured by the measurement of FIG. 4. FIGS. 6 and 7 are views explaining that the silicon melt (Si melt) received in the crucible is varied in flow in accordance with a temperature thereof.

Referring to FIG. 4, the heater 400 according to the embodiment of the present disclosure may melt a polycrystalline silicon supplied to the interior of the internal and external crucibles 200 and 250 by supplying heat to the internal and external crucibles 200 and 250, thereby producing a silicon melt (Si melt).

Thereafter, the silicon single crystal ingot growth apparatus 1000 according to the embodiment of the present disclosure may measure a temperature of the external crucible 250. The silicon single crystal ingot growth apparatus 1000 according to the embodiment of the present disclosure may measure a temperature of the external crucible 250 while rotating the external crucible 250 using the support 300.

In FIG. 5, a horizontal direction (an X direction) may represent time, and a vertical direction (a Y direction) may represent measurement temperature.

The silicon single crystal ingot growth apparatus 1000 according to the embodiment of the present disclosure may periodically have a certain measurement temperature period in accordance with a material of the surface of the external crucible 250 upon measuring a temperature of the external crucible 250 while rotating the external crucible 250 using the support 300. For example, the measurement temperature period may be about 300 seconds.

Accordingly, in the silicon single crystal ingot growth apparatus 1000 according to the embodiment of the present disclosure, it may be possible to align the coating surface (cf. "30*a*-30*b*" in FIGS. 1 and 2) with a magnetic field direction by calculating a temperature measurement position and the magnetic field direction based on the measurement temperature period of about 300 seconds. That is, the silicon single crystal ingot growth apparatus 1000 according to the embodiment of the present disclosure may align a coated portion of a graphite crucible with a magnetic field direction by calculating a temperature measurement position and the magnetic field direction based on a measurement temperature period.

In FIG. 5, "A" represents a temperature of a left side of the internal and external crucibles 200 and 250 when the first coating surface 30*a* is disposed at an outer surface of the first section 25*a*, and "B" represents a temperature of the left side of the internal and external crucibles 200 and 250 when the second coating surface 30*b* is disposed at an outer surface of the second section 25*b*. Hereinafter, this will be described in detail.

Referring to FIGS. 6(*a*) and 6(*b*), in the external crucible 250, the body thereof may be divided into the first section 25*a* and the second section 25*b*, and the first coating surface 30*a* may be disposed at an outer surface of the first section 25*a*.

The external crucible 250 may receive the same amount of heat through the heater 400 disposed at left and right sides of the external crucible 250, but the first section 25*a* mounted with the first coating surface 30*a* may receive higher heat than that of the second section 25*b*.

Since a greater amount of heat is transferred to the first section 25*a*, as compared to that of the second section 25*b* because the first coating surface 30*a* is mounted to the first section 25*a*, as shown in FIG. 6(*a*), left-side temperatures of the internal and external crucibles 200 and 250 may be higher than right-side temperatures of the internal and external crucibles 200 and 250. That is, the first section 25*a* mounted with the first coating surface 30*a*, which is a section having a higher temperature, is disposed at a left side with reference to a magnetic field direction shown in FIG. 6(*a*), and, as such, a greater amount of heat may be transferred to the left side of the internal and external crucibles 200 and 250.

Since a greater amount of heat may be transferred to the left side of the internal and external crucibles 200 and 250, as described above, the silicon melt (Si melt) received in the internal and external crucibles 200 and 250 may be rotated in a clockwise direction in the internal and external crucibles 200 and 250, as shown in FIG. 6(*b*). That is, the silicon melt (Si melt) may form a convection flow rotating in the clockwise direction in the internal and external crucibles 200 and 250.

On the other hand, referring to FIGS. 7(*a*) and 7(*b*), in the external crucible 250, the body thereof may be divided into the first section 25*a* and the second section 25*b*, and the second coating surface 30*b* may be disposed at an outer surface of the second section 25*b*.

Since a greater amount of heat is transferred to the second section 25*b*, as compared to that of the first section 25*a* because the second coating surface 30*b* is mounted to the second section 25*b*, as shown in FIG. 7(*a*), right-side temperatures of the internal and external crucibles 200 and 250 may be higher than left-side temperatures of the internal and external crucibles 200 and 250. That is, the second section 25*b* mounted with the second coating surface 30*b*, which is a section having a higher temperature, is disposed at a right side with reference to a magnetic field direction shown in FIG. 7(*a*), and, as such, a greater amount of heat may be transferred to the right side of the internal and external crucibles 200 and 250.

Since a greater amount of heat may be transferred to the right side of the internal and external crucibles 200 and 250, as described above, the silicon melt (Si melt) received in the internal and external crucibles 200 and 250 may be rotated in a counterclockwise direction in the internal and external crucibles 200 and 250, as shown in FIG. 7(*b*).

When the coating surface 30*a* or 30*b* is mounted to one of the first section 25*a* and the second section 25*b*, as described above, an amount of heat transferred to the internal and external crucibles 200 and 250 may be nonuniform and, as such, a rotation direction of the silicon melt (Si melt) in the internal and external crucibles 200 and 250 may be varied in accordance with a temperature of the internal and external crucibles 200 and 250. That is, the silicon melt (Si melt) may form a convection flow rotating in the counterclockwise direction in the internal and external crucibles 200 and 250.

In addition, in the silicon single crystal ingot growth apparatus 1000 according to the embodiment of the present disclosure, it may be possible to form a convection flow of the silicon melt (Si melt) in the clockwise direction or the counterclockwise direction by mounting the coating surface 30*a* or 30*b* at one of the first section 25*a* and the second section 25*b*, as described above with reference to FIGS. 6 and 7. When a magnet is additionally provided, it may also be possible to form a convection flow of the silicon melt (Si melt) in a desired direction during execution of a process.

FIGS. 8 to 13 are plan views explaining various embodiments of the external crucible of FIG. 1 configured to accommodate a silicon melt.

Figure 8:
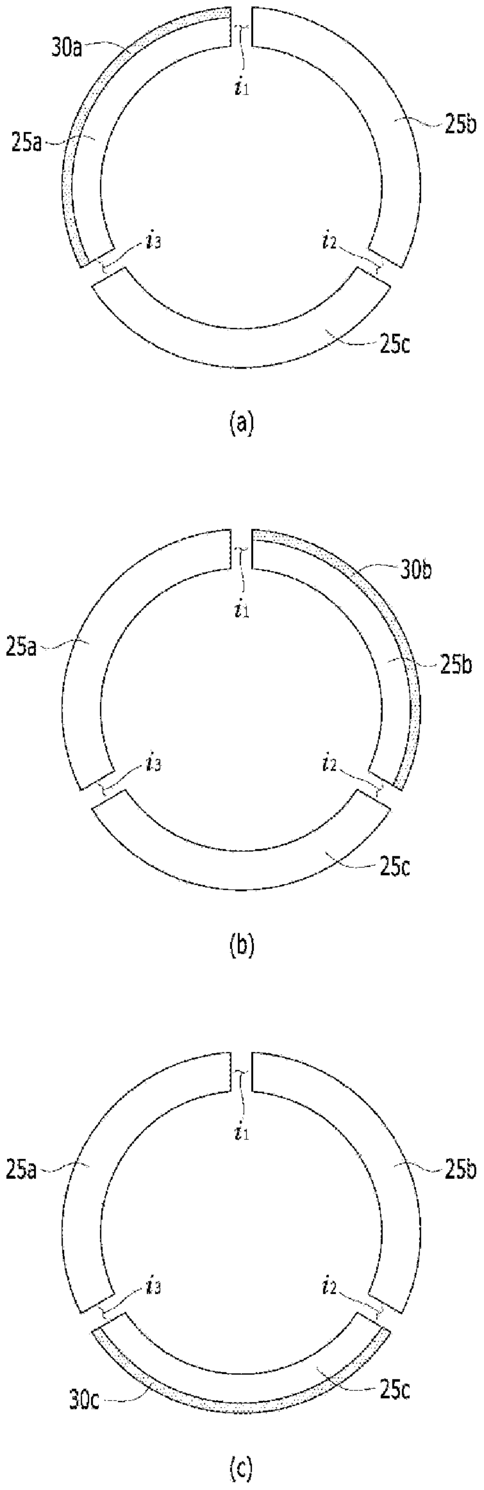
FIGS. 8(*a*) to 13(*b*) are plan views explaining various embodiments of the external crucible of FIG. 1 configured to accommodate a silicon melt.

Referring to FIGS. 8(*a*), 8(*b*), and 8(*c*), the external crucible 250 may include a body divided into a first section 25*a*, a second section 25*b*, and a third section 25*c*. In this case, gaps i1, i2, and i3 may be disposed between the first section 25*a* and the second section 25*b*, between the second section 25*b* and the third section 25*c*, and between the third section 25*c* and the first section 25*a*, respectively.

That is, the body may be divided into the first section 25*a*, the second section 25*b*, and the third section 25*c*, and a coating surface 30*a*-30*b*-30*c* coated with a material other than graphite may be mounted or coupled to an outer surface of at least one of the first section 25*a*, the second section 25*b*, or the third section 25*c*. Here, the outer surface may be referred to as an "outer circumferential surface" of the first section 25*a*, the second section 25*b* or the third section 25*c*.

The coating surface 30*a*-30*b*-30*c* may include a first coating surface 30*a*, a second coating surface 30*b*, and a third coating surface 30*c*.

For example, the first coating surface 30*a* may be mounted to the outer circumferential surface of the first section 25*a*, as shown in FIG. 8(*a*), the second coating surface 30*b* may be mounted to the outer circumferential surface of the second section 25*b*, as shown in FIG. 8(*b*), and the third coating surface 30*c* may be mounted to the outer circumferential surface of the third section 25*c*, as shown in FIG. 8(*c*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 25*a*, 25*b*, and 25*c*, and coating an outer circumferential surface of one of the sections with a material other than graphite (for example, SiC or the like). Accordingly, it may be possible to form an asymmetrical heat distribution of a silicon melt (Si melt) in an interior of the internal crucible (for example, a quartz crucible) with reference to a magnetic field direction.

Figure 9:
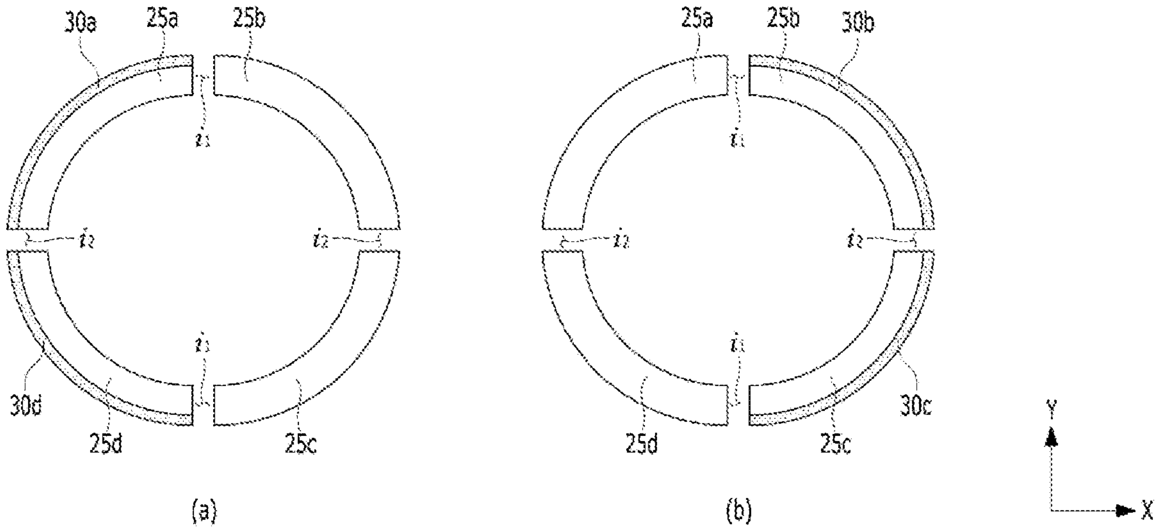

Referring to FIGS. 9(*a*) and 9(*b*), the external crucible 250 may include a body divided into a first section 25*a*, a second section 25*b*, a third section 25*c*, and a fourth section 25*d*. In this case, gaps i1 and i2 may be disposed between the first section 25*a* and the second section 25*b*, between the second section 25*b* and the third section 25*c*, between the third section 25*c* and the fourth section 25*d*, and between the fourth section 25*d* and the first section 25*a*, respectively.

That is, the body may be divided into the first section 25*a*, the second section 25*b*, the third section 25*c*, and the fourth section 25*d*, and a coating surface 30*a*-30*b*-30*c*-30*d* coated with a material other than graphite may be mounted or coupled to an outer surface of at least one of the first section 25*a*, the second section 25*b*, the third section 25*c*, or the fourth section 25*d*. Here, the outer surface may be referred to as an "outer circumferential surface" of the first section 25*a*, the second section 25*b*, the third section 25*c*, or the fourth section 25*d*.

The coating surface 30*a*-30*b*-30*c*-30*d* may include a first coating surface 30*a*, a second coating surface 30*b*, a third coating surface 30*c*, and a fourth coating surface 30*d*.

As shown in FIG. 9(*a*), the first coating surface 30*a* may be mounted to the outer circumferential surface of the first section 25*a*, and the fourth coating surface 30*d* may be mounted to the outer circumferential surface of the fourth section 25*d*. As shown in FIG. 9(*b*), the second coating surface 30*b* may be mounted to the outer circumferential surface of the second section 25*b*, and the third coating surface 30*c* may be mounted to the outer circumferential surface of the third section 25*c*.

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 25*a*, 25*b*, 25*c*, and 25*d*, and coating outer circumferential surfaces of one-side ones of the sections with a material other than graphite (for example, SiC or the like). Accordingly, it may be possible to form an asymmetrical heat distribution of a silicon melt (Si melt) in an interior of the internal crucible (for example, a quartz crucible) with reference to a magnetic field direction.

Figure 10:
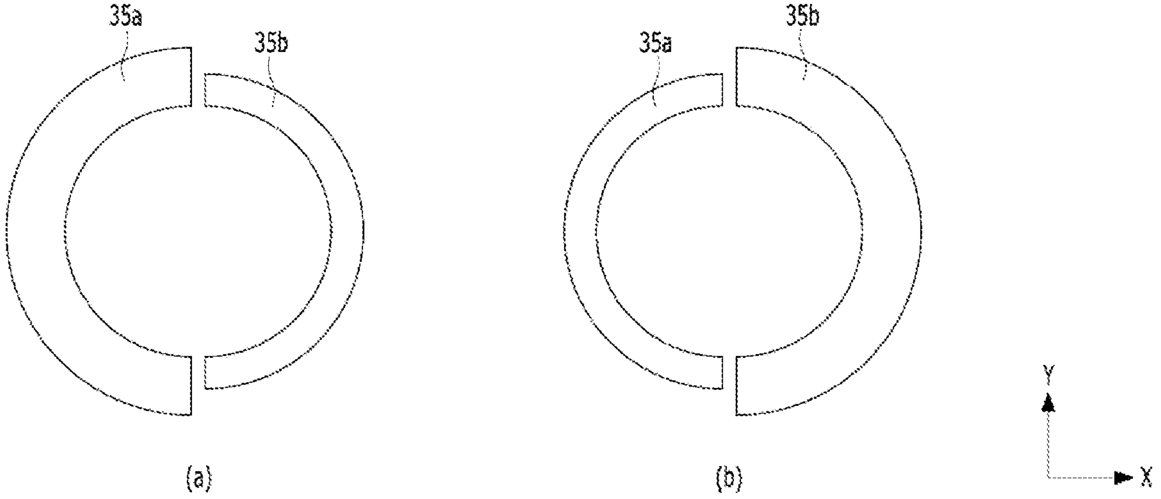

Referring to FIGS. 10(*a*) and 10(*b*), the external crucible 250 may include a body divided into a first section 35*a* and a second section 35*b*. In this case, gaps i may be disposed between one end of the first section 35*a* and one end of the second section 35*b* and between the other end of the first section 35*a* and the other end of the second section 35*b*, respectively.

That is, the body may be divided into the first section 35*a* and the second section 35*b*, and the first section 35*a* and the second section 35*b* may be formed to have different thicknesses, respectively.

As shown in FIG. 10(*a*), the first section 35*a* may be formed to have a greater thickness than that of the second section 35*b*. On the other hand, as shown in FIG. 10(*b*), the second section 35*b* may be formed to have a greater thickness than that of the first section 35*a*.

Heat transferred from an external crucible (for example, a graphite crucible) to an internal crucible (for example, a quartz crucible) may be reduced when the heat transfer is carried out through a thicker section of the external crucible, for example, the first section 35*a* in FIG. 10(*a*) or the second section 35*b* in FIG. 10(*b*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 35*a* and 35*b*, and forming one of the sections to have a thickness different from those of the remaining sections.

Accordingly, it may be possible to form an asymmetrical heat distribution of a silicon melt (Si melt) in an interior of the internal crucible (for example, a quartz crucible) with reference to a magnetic field direction.

Figure 11:
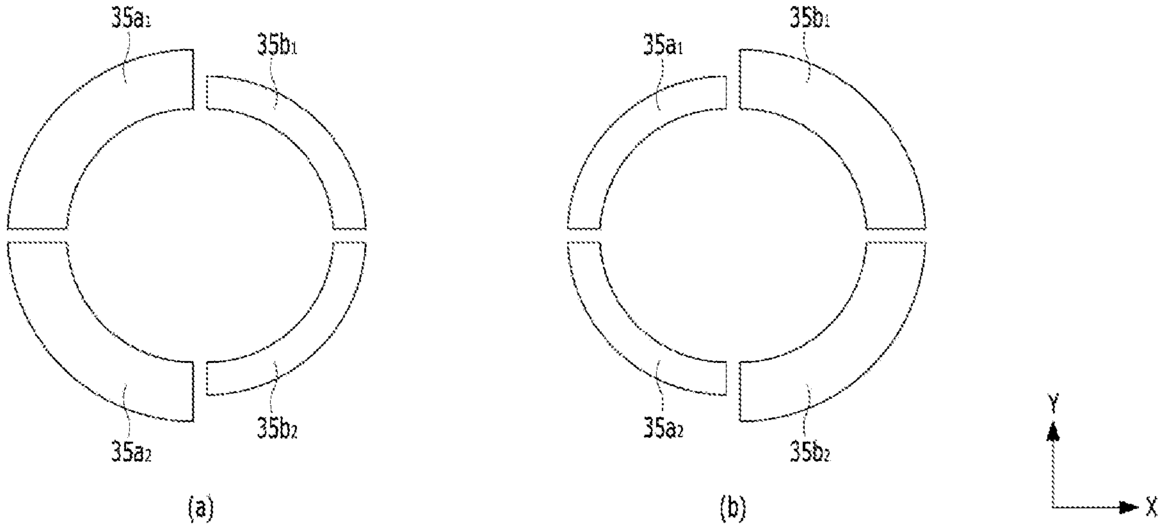

Referring to FIGS. 11(*a*) and 11(*b*), the external crucible 250 may include a body divided into a 1-1th section 35*a*1, a 1-2th section 35*a*2, a 2-1th section 35*b*1, and a 2-2th section 35*b*2.

Gaps may be disposed between the 1-1th section 35*a*1 and the 2-1th section 35*b*1, between the 2-1th section 35*b*1 and the 2-2th section 35*b*2, between the 2-2th section 35*b*2 and the 1-2th section 35*a*2, and between the 1-2th section 35*a*2 and the 1-1th section 35*a*1, respectively.

That is, the body may be divided into the 1-1th section 35*a*1, the 1-2th section 35*a*2, the 2-1th section 35*b*1, and the 2-2th section 35*b*2, the 1-1th section 35*a*1 and the 1-2th section 35*a*2 may be formed to have substantially the same thickness, the 1-1th section 35*a*1 and the 2-1th section 35*b*1 may be formed to have different thicknesses, respectively, and the 1-1th section 35*a*1 and the 2-2th section 35*b*2 may be formed to have different thicknesses, respectively. Of course, the present disclosure is not limited to the above-described conditions.

As shown in FIG. 11(*a*), the 1-1th section 35*a*1 and the 1-2th section 35*a*2 may have a greater thickness than those of the 2-1th section 35*b*1 and the 2-2th section 35*b*2. On the other hand, as shown in FIG. 11(*b*), the 2-1th section 35*b*1 and the 2-2th section 35*b*2 may have a greater thickness than those of the 1-1th section 35*a*1 and the 1-2th section 35*a*2.

Heat transferred from an external crucible (for example, a graphite crucible) to an internal crucible (for example, a quartz crucible) may be reduced when the heat transfer is carried out through a thicker section of the external crucible, for example, the 1-1th section 35*a*1 and the 1-2th section 35*a*2 in FIG. 11(*a*) or the 2-1th section 35*b*1 and the 2-2th section 35*b*2 in FIG. 11(*b*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 35*a*1, 35*a*2, 35*b*1, and 35*b*2, and forming the sections to have different thicknesses.

Accordingly, it may be possible to form an asymmetrical heat distribution of a silicon melt (Si melt) in an interior of the internal crucible (for example, a quartz crucible) with reference to a magnetic field direction.

Figure 12:
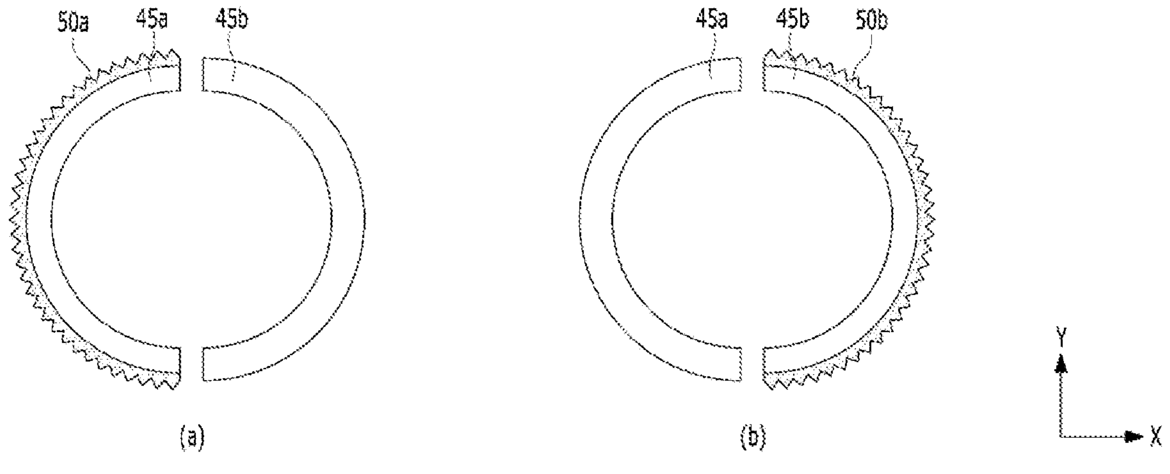

Referring to FIGS. 12(*a*) and 12(*b*), the external crucible 250 may include a body divided into a first section 45*a* and a second section 45*b*. In this case, gaps i may be disposed between one end of the first section 45*a* and one end of the second section 45*b* and between the other end of the first section 45*a* and the other end of the second section 45*b*, respectively.

That is, the body may be divided into the first section 45*a* and the second section 45*b*, and the first section 35*a* and the second section 35*b* may be formed to have different surface areas at outer surfaces 50*a* and 50*b* thereof, respectively.

As shown in FIG. 12(*a*), the first section 45*a* may be formed to have protrusions, mountains, valleys, etc. at the outer surface 50*a* thereof and, as such, may have a greater surface area than that of the second section 45*b* at the outer surface 50*b* thereof. On the other hand, as shown in FIG. 12(*b*), the second section 45*b* may be formed to have protrusions, mountains, valleys, etc. at the outer surface 50*b* thereof and, as such, may have a greater surface area than that of the first section 45*a* at the outer surface 50*a* thereof.

Heat transferred from an external crucible (for example, a graphite crucible) to an internal crucible (for example, a quartz crucible) may be increased when the heat transfer is carried out through a section of the external crucible having a greater surface area at an outer surface thereof, for example, the first section 45*a* in FIG. 12(*a*) or the second section 45*b* in FIG. 12(*b*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 45*a* and 45*b*, and forming one of the sections to have a surface area different from those of the remaining sections.

Accordingly, it may be possible to form an asymmetrical heat distribution of a silicon melt (Si melt) in an interior of the internal crucible (for example, a quartz crucible) with reference to a magnetic field direction.

Figure 13:
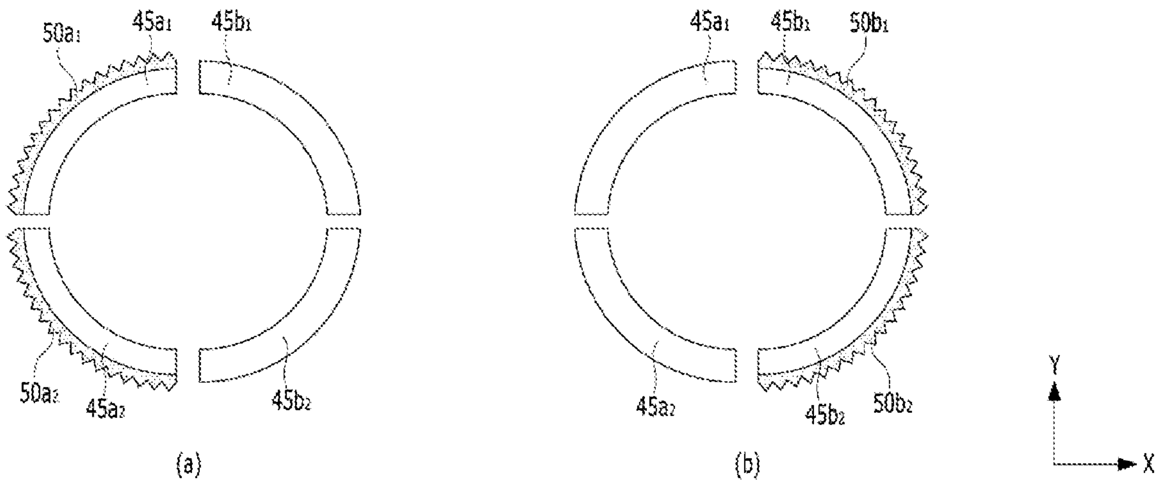

Referring to FIGS. 13(*a*) and 13(*b*), the external crucible 250 may include a body divided into a 1-1th section 45*a*1, a 1-2th section 45*a*2, a 2-1th section 45*b*1, and a 2-2th section 45*b*2.

Gaps may be disposed between the 1-1th section 45*a*1 and the 2-1th section 45*b*1, between the 2-1th section 45*b*1 and the 2-2th section 45*b*2, between the 2-2th section 45*b*2 and the 1-2th section 45*a*2, and between the 1-2th section 45*a*2 and the 1-1th section 45*a*1, respectively.

That is, the body may be divided into the 1-1th section 45*a*1, the 1-2th section 45*a*2, the 2-1th section 45*b*1, and the 2-2th section 45*b*2, an outer surface 50*a*1 of the 1-1th section 45*a*1 and an outer surface 50*a*2 of the 1-2th section 45*a*2 may be formed to have substantially the same surface area, the outer surface 50*a*1 of the 1-1th section 45*a*1 and an outer surface 50*b*1 of the 2-1th section 45*b*1 may be formed to have different surface areas, respectively, and the outer surface 50*a*1 of the 1-1th section 45*a*1 and an outer surface 50*b*2 of the 2-2th section 45*b*2 may be formed to have different surface areas, respectively. Of course, the present disclosure is not limited to the above-described conditions.

As shown in FIG. 13(*a*), the outer surface 50*a*1 of the 1-1th section 45*a*1 and the outer surface 50*a*2 of the 1-2th section 45*a*2 may have a greater surface area than those of the outer surface 50*b*1 of the 2-1th section 45*b*1 and the outer surface 50*b*2 of the 2-2th section 45*b*2. On the other hand, as shown in FIG. 13(*b*), the outer surface 50*b*1 of the 2-1th section 45*b*1 and the outer surface 50*b*2 of the 2-2th section 45*b*2 may have a greater surface area than those of the outer surface 50*a*1 of the 1-1th section 45*a*1 and the outer surface 50*a*2 of the 1-2th section 45*a*2.

Heat transferred from an external crucible (for example, a graphite crucible) to an internal crucible (for example, a quartz crucible) may be increased when the heat transfer is carried out through a section of the external crucible having a greater surface area at an outer surface thereof, for example, the 1-1th section 45*a*1 having the outer surface 50*a*1 and the 1-2th section 45*a*2 having the outer surface 50*a*2 in FIG. 13(*a*) or the 2-1th section 45*b*1 having the outer surface 50*b*1 and the 2-2th section 45*b*2 having the outer surface 50*b*2 in FIG. 13(*b*).

As described above, in accordance with the present disclosure, it may be possible to asymmetrically form an external crucible (for example, a graphite crucible) configured to support an internal crucible (for example, a quartz crucible) by dividing the external crucible, for example, the external crucible 250, into at least two sections, for example, the sections 45*a*1, 45*a*2, 45*b*1, and 45*b*2, and forming the sections to have different surface areas at outer surfaces thereof.

Accordingly, it may be possible to form an asymmetrical heat distribution of a silicon melt (Si melt) in an interior of the internal crucible (for example, a quartz crucible) with reference to a magnetic field direction.

Figure 14:
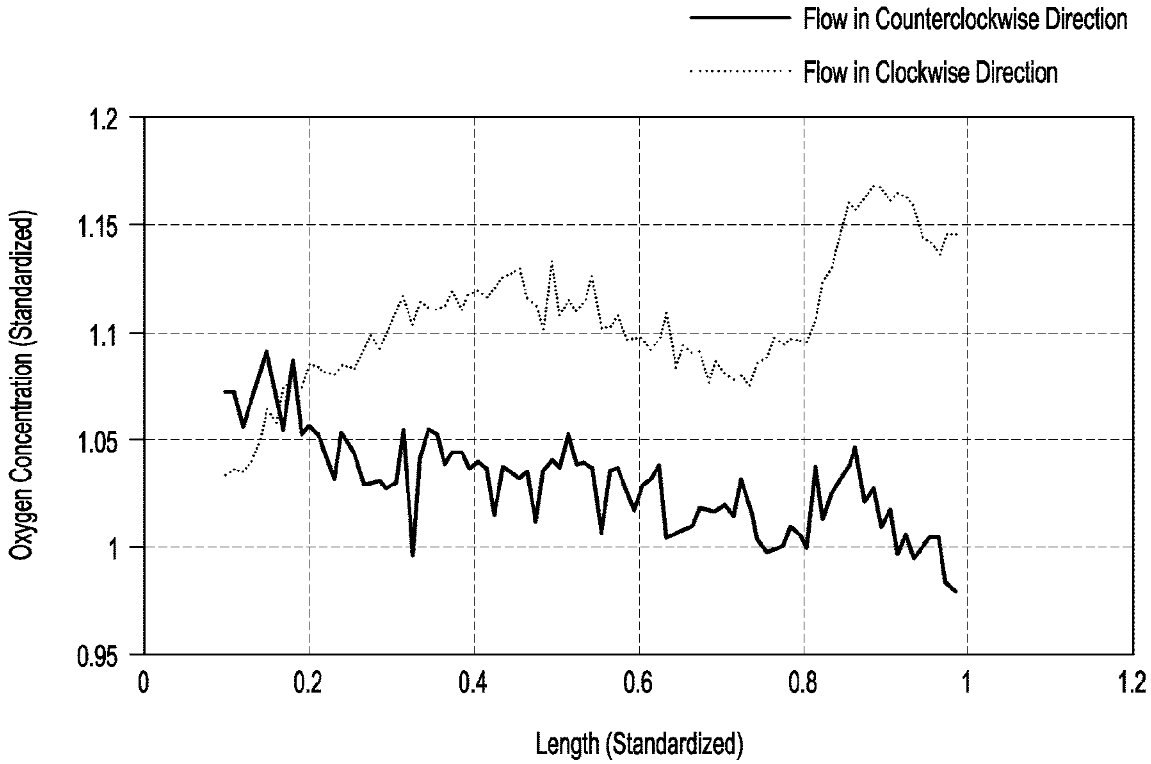
FIG. 14 is a graph explaining supply of oxygen from an internal quartz crucible in a process of growing a silicon single crystal ingot.

FIG. 14 is a graph explaining supply of oxygen from an internal quartz crucible in a process of growing a silicon single crystal ingot.

Referring to FIG. 14, an oxygen concentration Oi of a silicon single crystal ingot after growth of the silicon single crystal ingot using an external crucible formed to have an asymmetrical structure is shown. In FIG. 14, a horizontal axis represents a length of the silicon single crystal ingot, and a vertical axis represents an oxygen concentration of the silicon single crystal ingot. That is, FIG. 14 may represent a variation in oxygen concentration of a growing silicon single crystal ingot when a silicon melt in the crucible forms a convection flow in a clockwise direction or a counterclockwise direction.

Reaction between a silicon oxide introduced from a quartz crucible and a silicon melt may be represented by the following chemical formula 1:

$$SiO_2 + Si \rightarrow 2Si + 2O \qquad \text{<Chemical Formula 1>}$$

Silicon atoms and oxygen atoms, which are resultant products of Chemical Formula 1, may be transferred to a surface of the silicon melt through convection of the silicon melt.

$$Si + O \rightarrow SiO \qquad \text{<Chemical Formula 2>}$$

A silicon atom and an oxygen atom may be coupled, as shown in the above Chemical Formula 2, and, as such, may be evaporated from the surface of the silicon melt.

In the case of a silicon single crystal ingot growth apparatus including an external crucible and an internal crucible, which have structures according to the above-described embodiments, heat transferred to the internal crucible may be varied because the external crucible may have an asymmetrical structure and, as such, it may be possible to grow ingots having various oxygen concentrations without changing an insulator.

In an external crucible according to each of embodiments of the present disclosure, which is configured to accommodate a silicon melt, and a silicon single crystal ingot growth apparatus including the external crucible, at least one section of the external crucible may be formed to be asymmetrical from the remaining sections of the external crucible and, as such, it may be possible to grow ingots having various oxygen concentrations without changing an insulator.

In the external crucible according to each of embodiments of the present disclosure, which is configured to accommodate a silicon melt, and the silicon single crystal ingot growth apparatus including the external crucible, a more rapid process may be carried out because ingots having various oxygen concentrations may be grown without change of the insulator.

In the external crucible according to each of embodiments of the present disclosure, which is configured to accommodate a silicon melt, and the silicon single crystal ingot growth apparatus including the external crucible, it may be possible to obtain ingots having various oxygen concentrations through change of a convention flow direction of a melt even in a situation in which change of an insulator, an air flow path, etc. is impossible due to completion of melting of polycrystalline silicon.

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

What is claimed is:

1. An apparatus for growing a silicon single crystal, the apparatus comprising:

a chamber;

an internal quartz crucible provided in an interior of the chamber and configured to accommodate a silicon melt;

an external graphic crucible divided into at least two sections and including a body configured to accommodate the internal quartz crucible;

a heater provided in the interior of the chamber and disposed around the external crucible;

a coolant tube provided at an upper portion of the interior of the chamber in a fixed state and disposed around an ingot rising while being grown from the silicon melt;

a heat shield provided at an upper portion of the quartz crucible; and a support configured to rotate the external crucible, wherein a size of an outer diameter of every section of the external graphite crucible is the same, and a size of an inner diameter of every section of the external graphite crucible is the same, wherein at least one section of the external graphite crucible comprises a coating surface mounted on an outer circumferential surface of the body not contacting the silicon melt, wherein a thickness of the at least one section of the body having the coating surface is smaller than a thickness of the other sections of the body of the external graphite crucible, wherein the at least one section of the at least two sections is formed to have different thermal conductivities from the remaining sections of the at least two sections, and wherein a greater amount of heat is transferred to a section among the at least two sections of the external graphite crucible by a convection flow of the silicon melt due to an asymmetrical heat distribution in an interior of the internal quartz crucible with reference to a magnetic field direction.

2. The apparatus according to claim 1, wherein the coating surface is made of a material different from a material of the body.

3. The apparatus according to claim 1, wherein the at least two sections are symmetrical with respect to a center of the body.

4. The apparatus according to claim 1, wherein gaps are formed among the at least two sections, respectively.

5. The apparatus according to claim 1, wherein:

the coating surface is made of an SiC material.

* * * * *